United States Patent
Johnson, Jr. et al.

(10) Patent No.: US 9,053,941 B2
(45) Date of Patent: Jun. 9, 2015

(54) PHOTOLITHOGRAPHICALLY DEFINED CONTACTS TO CARBON NANOSTRUCTURES

(75) Inventors: Alan T. Johnson, Jr., Philadelphia, PA (US); Ryan A. Jones, Potomac, MD (US); Samuel M. Khamis, San Francisco, CA (US)

(73) Assignee: The Trustees Of The University Of Pennsylvania, Philadelphia, PA (US)

(*) Notice: Subject to any disclaimer, the term of this patent is extended or adjusted under 35 U.S.C. 154(b) by 702 days.

(21) Appl. No.: 13/318,682

(22) PCT Filed: May 7, 2010

(86) PCT No.: PCT/US2010/033968
§ 371 (c)(1),
(2), (4) Date: Jan. 19, 2012

(87) PCT Pub. No.: WO2010/132284
PCT Pub. Date: Nov. 18, 2010

(65) Prior Publication Data
US 2012/0129273 A1    May 24, 2012

Related U.S. Application Data

(60) Provisional application No. 61/177,768, filed on May 13, 2009.

(51) Int. Cl.
| H01L 21/027 | (2006.01) |
| H01L 21/64  | (2006.01) |
| B82Y 40/00  | (2011.01) |
| H01L 51/00  | (2006.01) |
| B82Y 10/00  | (2011.01) |
| B82Y 30/00  | (2011.01) |
| H01L 51/05  | (2006.01) |

(52) U.S. Cl.
CPC ............ *H01L 21/0271* (2013.01); *B82Y 40/00* (2013.01); *H01L 51/0032* (2013.01); *B82Y 10/00* (2013.01); *B82Y 30/00* (2013.01); *H01L 51/0048* (2013.01); *H01L 51/0545* (2013.01); *H01L 51/0558* (2013.01)

(58) Field of Classification Search
None
See application file for complete search history.

(56) References Cited

U.S. PATENT DOCUMENTS

| 4,569,897 | A | * | 2/1986 | Kalyanaraman | ............ 430/197 |
| 5,039,358 | A |   | 8/1991 | Birkle et al. | |
| 5,556,812 | A | * | 9/1996 | Leuschner et al. | ............ 438/623 |

(Continued)

FOREIGN PATENT DOCUMENTS

| JP | 2004-045707 | 2/2004 |
| WO | WO 2006/113719 | 10/2006 |

(Continued)

OTHER PUBLICATIONS

Duan, X., et al. "Indium Pohsphide nanowires as building blocks for nanoscale electronic and optoelectronic devices", Nature, 409(4), pp. 66-69 (Jan. 4, 2001).*

(Continued)

*Primary Examiner* — Joseph Schoenholtz
(74) *Attorney, Agent, or Firm* — Baker & Hostetler LLP (57) ABSTRACT

Methods for the fabrication of nanostructures, including nanostructures comprised of carbon nanotubes, and the nanostructures, devices, and assemblies prepared by these methods, are described.

39 Claims, 4 Drawing Sheets

(56) References Cited

U.S. PATENT DOCUMENTS

| | | | |
|---|---|---|---|
| 6,720,553 B2 * | 4/2004 | Bonnell et al. | 250/252.1 |
| 6,750,135 B2 | 6/2004 | Elenius et al. | |
| 7,410,820 B2 * | 8/2008 | Jacobs et al. | 438/51 |
| 7,429,446 B2 | 9/2008 | Sawada et al. | |
| 2007/0096616 A1 * | 5/2007 | Han et al. | 313/309 |
| 2007/0215960 A1 * | 9/2007 | Zhu et al. | 257/414 |
| 2008/0073754 A1 * | 3/2008 | Zampini et al. | 257/642 |
| 2008/0315092 A1 * | 12/2008 | Kley | 250/307 |
| 2009/0108251 A1 * | 4/2009 | Kabir | 257/14 |

FOREIGN PATENT DOCUMENTS

| | | |
|---|---|---|
| WO | WO 2006110347 A2 * | 10/2006 |
| WO | WO 2006113719 A2 * | 10/2006 |

OTHER PUBLICATIONS

Photoresists downloaded from URL<http://www.azem.com/en/Products/Litho-technology/Photoresists.aspx> on Jul. 16, 2014.*

PMEG downloaded from URL<http://www.inchem.org/documents/sids/sids/107982.pdf> on Jul. 16, 2014.*

AZ 5200 Datasheet downloaded from URL<http://cleanroom.ien.gatech.edu/media/resources/processing/AZ5200.pdf> on Jul. 16, 2014.*

Ueda, Tsuyoshi, Hideyuki Norimatsu, M.m.h. Bhuiyan, Tomoaki Ikegami, and Kenji Ebihara. "Properties of Gas Sensor Using CNTs Thin Film Prepared by PLD/CVD Method." MRS Proceedings 900 (2005).*

International Patent Application No. PCT/US2010/033968: International Search Report and Written Opinion dated Jul. 9, 2010, 10 pages.

* cited by examiner

PHOTOLITHOGRAPHICALLY DEFINED CONTACTS TO CARBON NANOSTRUCTURES

CROSS-REFERENCE TO RELATED APPLICATIONS

This application is the National Stage of International Application No. PCT/US2010/033968, filed May 7, 2010, which claims the benefit of U.S. Provisional Application No. 61/177,768, filed May 13, 2009, the disclosures of which are incorporated herein by reference in their entireties.

TECHNICAL FIELD

The present invention is directed to improved methods for fabricating nanostructures and the nanostructures, devices, and assemblies prepared by these methods.

BACKGROUND

Since the discovery of single walled carbon nanotubes almost twenty years ago, there has been much interest in their use as electronic circuit elements. Applications ranging from field effect transistors ("FETs") to chemical sensors to flow meters have been explored. The most common method for fabricating single walled carbon nanotube circuits since their inception has been electron beam lithography. One drawback to electron beam lithography is that it is a serial process. As such, the production of large arrays of devices or complex circuits requires a system to run for hours, possibly days, at a time. This is both time consuming and costly. By contrast, photolithography has been a standard processing technique in the production of complementary metal-oxide semiconductor (CMOS) processing since the 1960's and its parallel nature allows for wafer scale production of circuits in a matter of seconds.

To date, all attempts to use photolithographically defined carbon nanotubes have reported several problems. One method of incorporating carbon nanotubes into such devices has been to photolithographically define leads onto a substrate, and subsequently grow the carbon nanotubes across the leads allowing for devices. This provides for a so-called "side contact" geometry, wherein the carbon nanotubes essentially rests on the surface of the metal contacts. The resulting electrical contacts are inferior, owing to the reduced contact areas. A more desirable mode of contact is to first deposit the carbon nanotube onto the surface and, following photolithographically defining the metal circuit traces, deposit the metal onto the carbon nanotubes. This results in an electrical contact, known as an "end contact" wherein the metal contacts conform all around the ends of the carbon nanotubes. Unfortunately, practitioners of this method report the formation or presence of what is believed to be a residual "scum" layer resulting from the use of conventional photoresists. There exists a need to develop methodologies which provide for end contact connections of nanotubes which do not suffer from the problems associated with residual photoresist processing scum.

SUMMARY

The present invention features nanostructure devices and methods for preparing the same. The invention enables fabrication of nanostructure devices with excellent electrical connectivity between metallic conductors controlled with photolithographic precision.

In one embodiment, the invention describes a method for preparing a nanostructure comprising one or more nanodimensioned devices comprising the steps of providing a substrate having at least one nanodimensioned device superposed upon it, coating at least a portion of the nanodimensioned device with at least one layer of a passivating layer, which does not substantially interact with the nanodimensioned device, and coating at least a portion of the passivating material layer with at least one photoresist, and an article resulting from this method.

This invention also teaches a method for preparing a nanostructure in which the passivating layer is substantially free from pi-bond conjugated aromatic moieties, and an article resulting from this method.

In one embodiment, the invention teaches that the passivating layer is a polymer or polymer precursor, preferably a aliphatic polymer such as polyglutarimide or polyalkyl glutarimide, for this purpose, and an article resulting from this method. Other polymers comprising saturated backbones, including, but not limited to, saturated acrylates, polyesters, and polyolefins may also be used. In other embodiments, the passivating layer is comprised essentially of saturated waxes or aliphatic surfactants. In still other embodiments, the passivating layer may comprise metals, such as gold or aluminum, providing that this metallic passivating layer can be selectively removed in the presence of, and without compromising the integrity of, the photoresist, nanostructure, or final conductors.

This invention teaches a method for preparing a nanostructure comprising a conducting nanotube or nanowire, a semiconducting nanotube or nanowire, a metallic nanotube or nanowire, a mat of conducting, semiconducting, or metallic nanotubes or nanowires, or combinations or pluralities thereof, and an article resulting from this method. Further, the invention teaches a method for preparing a nanostructure comprising at least one carbon nanotube or nanowire, graphene, graphene oxide, reduced graphene oxide, or mixtures thereof is suitable for this purpose, and an article resulting from this method.

Additionally, this invention teaches that conventional materials and processing techniques used in photolithographic wafer processing can be used in combination with the teachings described herein, as well as the articles made from such processing, thereby obviating the need for electron beam imaging and dramatically increasing the throughput of fabrication.

For example, in one embodiment, fabrication of a nanostructure further comprises the image-wise removing portions of the photoresist and passivating layer, be it polymer or polymer precursor, or otherwise, to form at least one pattern in which at least some part of at least one nanodimensioned device is not covered by the photoresist and passivating layer.

In another embodiment, fabrication of a nanostructure further comprises applying electrically conducting or semiconducting material to at least some portions of the nanodimensioned device exposed by removal of the photoresist and passivating layer portions, such that electrical contact is made between the electrically conducting or semiconducting material and at least some part of at least one nanodimensioned device. This results in an electrical contact, known as an "end contact" wherein the metal contact is all around the end of the carbon nanotube, which is far superior to so-called "side contact" connections, because of the improved intimacy of the electrical connection associated with the former.

In another embodiment, fabrication of a nanostructure further comprises annealing the nanostructure. In further embodiments, the annealing is conducted at a temperature above the boiling points of any solvents used in the processing or solvents or monomers originally contained in the at least one passivating material or the at least one photoresist. In still further embodiments, the annealing temperature is in a range of from about 100 to about 300 degrees Celsius.

The invention also teaches a method of making a nanostructure which comprises adhering biological molecules to at least some portions of the nanodimensioned devices, and the associated nanostructures.

In other embodiments, a nanostructure with or without an electrical circuit is provided either singly or as an array on a single substrate.

The invention teaches a nanostructure which has been optionally annealed and/or overcoated with one or more protective coating layers.

The invention also teaches the modules or assemblies comprising nanostructures so-described.

DETAILED DESCRIPTION OF ILLUSTRATIVE EMBODIMENTS

The present invention may be understood more readily by reference to the following detailed description taken in connection with the accompanying Figures and Examples, which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to the method of preparing such devices and to the resulting, corresponding physical devices themselves.

In the present disclosure the singular forms "a," "an," and "the" include the plural reference, and reference to a particular numerical value includes at least that particular value, unless the context clearly indicates otherwise. Thus, for example, a reference to "a material" is a reference to one or more of such materials and equivalents thereof known to those skilled in the art, and so forth. When values are expressed as approximations, by use of the antecedent "about," it will be understood that the particular value forms another embodiment. Where present, all ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

The term "adjacent" means, near, next to or adjoining Something adjacent may also be in contact with another component, surround the other component, be spaced from the other component or contain a portion of the other component. For instance, a carbon nanotube that is adjacent to a surface or plate, may be next to the surface or plate, on the surface or plate, embedded in the surface or plate, fixed to the surface or plate, contact the surface or plate, surround the surface or plate, comprise a portion of the surface or plate.

The term "contact" means in direct physical abutment, without regard for the presence or requirement of any chemical bonding. For instance, a passivating layer that is in contact with a carbon nanotube may be physically near so as to abut against the carbon nanotube so as to exhibit van der Waals attraction, without pi-pi overlap or covalent or ionic bonding. The term "electrical contact" refers to the contact between one conductor and another conductor or semiconductor device, such that when an electrical potential is applied across the junction, a current will pass. As such, an "electrical contact" is meant to refer to a more intimate connection between the associated materials.

The term "nanodimensioned" refers to a physical size and scale, such that the article being described as nanodimensioned (e.g., particle, layer, tube, or fiber) has at least one dimension between about 0.5 and about 1000 nanometers. For example, nanodimensioned tube or fiber may have a diameter within this range, a nanodimensioned layer has a thickness of this scale, and a nanodimensioned particle is one in which at least one aspect dimension of the particle is between about 0.5 nanometers and about 1000 nanometers. Accordingly, a "nanodimensioned device" or a "nanostructure" is a device or structure which contains at least one article (e.g., particle, layer, tube, or fiber) having at least one dimension between about 0.5 nanometers and about 1000 nanometers.

The invention may utilize a variety of nanostructures, including a wide array of structures familiar to those skilled in the art. The simplest nanostructures are single-wall nanotubes (SWNTs). Nanostructures include bundles of SWNTs, double-wall or coaxial nanotubes (CATs), and multi-wall nanotubes (MWNTs). Other nanostructures that are appropriately used in accordance with the invention include nanowires and $C_{40}$, $C_{60}$, or $C_{70}$ encapsulating nanotubes. Nanotubes may also be infused with inorganic elements, such as Si, GaAs, or GaN. The terms "graphene," "graphene oxide," and "reduced graphene oxide" refer to planar arrays of carbon atoms, comprising one or more (e.g., 2-20) layers of such planar arrays. These nanostructures can be constructed using a variety of techniques, including chemical vapor deposition or sol-gel processing. In the case of graphene, graphene oxide, or other layered, planar structures, the nanostructures may also be applied by transfer printing techniques, in which individual or multiple layers are applied.

Further, nanostructures can be comprised of carbon, but are not limited to this material. For example, nanodevices may be electrically conducting or semi-conducting, comprising semiconductor materials such as doped or undoped silicon, GaAs, or InP, or metals such as gold, silver, nickel, or zinc may also be used.

The term "passivating layer" or "passivating material layer" refers to a material or layer of material which contacts the nanodimensioned device, which does not substantially chemically bond to the device, for example, by pi-pi overlap or covalent or ionic bonding, but which has sufficient tenacity to survive subsequent application and removal of any overlaid aromatic photoresist. This tenacity may be achieved by its own physical integrity (e.g., high melting point or polymer network) either as applied or after appropriate curing. The passivating layer may be applied as a solution or suspension in which the passivating material is dispersed, followed by removal of the solvent. Alternatively, the passivating material may be applied neat or as a dispersed or dissolved precursor which is transformed into a sufficiently tenacious layer by the application of light, heat, pH, or other physical or chemical trigger. Examples of such passivating materials include essentially aliphatic (saturated) organic molecules, such as high melting waxes, aliphatic surfactants, or saturated or essentially saturated polymers.

Additionally, the passivating layer may be comprised of metals, such as gold or aluminum. In such cases, however, this metallic passivating layer must be chosen so that its selective removal does not compromise the integrity of the photoresist, nanostructure, or final conductors.

The disclosures of each patent, patent application, and publication cited or described in this document are hereby incorporated herein by reference, in their entirety.

As described in the Background, a critical shortfall in incorporating nanodimensioned devices using standard CMOS processing techniques is the inherent incompatibility of existing aromatic photoresists and those chemically unsaturated nanodimensioned materials currently finding favor for use as nanodevices—including, e.g., carbon nanotubes (CNTs). The inherent chemical compatibilities of these materials, coupled with the standard processing conditions associated with photoresist processing, is believed to give rise to the presence of scum at the metal conductor—nanodevice interface. This scum layer may arise from this chemical interaction, and the inability of existing standard chemical processing leaves behind chemical residues which interferes with the electrical contract between the metal conductor-nanodevice interface. The present invention includes a number of embodiments whose purpose and intent is to prevent such deleterious materials from forming in the first place. The success of this invention appears to lend credence to this concept of residual scum, but the invention is not bound by it existence or absence.

In one embodiment, the invention describes a method for preparing a nanostructure (and the nanostructure itself) comprising one or more nanodimensioned devices comprising the steps of providing a substrate having at least one nanodimensioned device superposed upon it, coating at least a portion of the nanodimensioned device with at least one layer of a passivating layer, which does not substantially interact with the nanodimensioned device, and coating at least a portion of the passivating material layer with at least one photoresist. The presence of this passivating layer may be considered to act as an intercept layer, preventing the initial and immediate contact between the nanodimensioned device and the photoresist.

The nature of the passivating layer can be important in achieving this purpose. That is, a passivating layer which is substantially free from pi-bond conjugated aromatic moieties is preferred, and may be comprised of a polymer or polymer precursor, and/or essentially of saturated waxes or aliphatic surfactants. The term "waxes" is intended to embody those hydrophobic materials, both natural and synthetic triglycerides, which are plastic (malleable) solids at room temperature, with melting points above the process temperatures required for normal photoresist processing. More particularly, the use of aliphatic polymers such as polyglutarimide or polyalkyl glutarimide is preferred for this purpose, but other polymers with aliphatic backbones may also be employed; for example, aliphatic or saturated acrylate, polyester, or polyolefin polymers or precursors.

Figure 1:
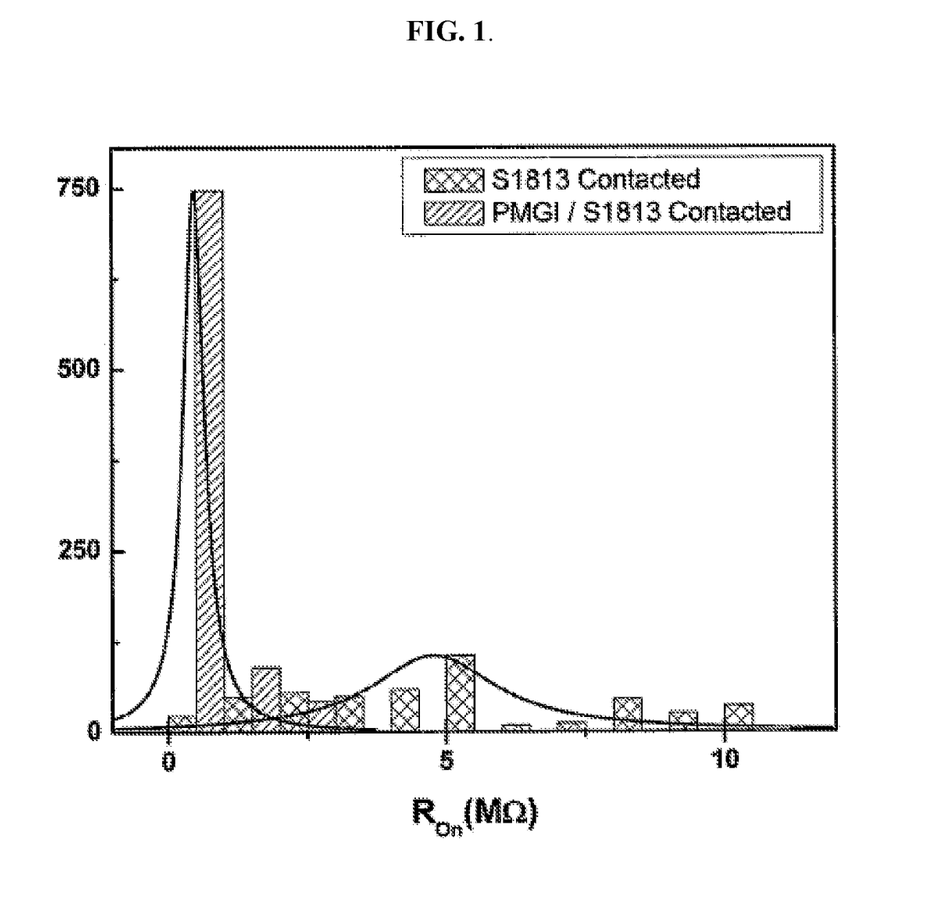
FIG. 1 presents a histogram showing the on-state resistance of devices fabricated both with a PMGI/S1813 bilayer of resist, and a single layer of S1813 resist.

For example, FIG. 1 shows some of the benefits derived from the use of such a passivating layer, both on the absolute and scatter values of performance. FIG. 1 shows the histogram results of the on-state resistance of devices fabricated both with a polydimethyl glutarimide/Shipley S1813 (PMGI/S1813) bilayer of resist, and a single layer of Shipley S1813 photoresist (i.e., without the PMGI layer). The use of the PMGI as a passivating layer between the nanodevice and the photoresist, and associated avoidance of the formation of the scum layer, yielded circuits with absolutely lower and less scattered resistance values, relative to processing the circuits with the photoresist alone.

In some cases, it may be advantageous to include photoactive additives into the passivating material to make the passivating layer susceptible to imaging and photoprocessing, consistent with the processing requirements of the subsequently overlaid photoresist. Often such additives, by their very nature, contain unsaturated moieties which react selectively with light, for example, to polymerize or depolymerize the bulk structure. It should be recognized that the presence of such additives may be acceptable, provided they do not compromise the essential aliphatic nature of the passivating material.

This invention is flexible as to the nature of the nanostructure and nanodevices which may be employed. The method of fabricating nanostructures accommodates such nanodevices as one or more conducting nanotube or nanowire, semiconducting nanotube or nanowire, metallic nanotube or nanowire, mat of conducting, semiconducting, or metallic nanotubes or nanowires, or combinations or pluralities thereof. Preferably, the nanodevice comprises at least one carbon nanotube or nanowire, graphene, graphene oxide, reduced graphene oxide, or mixtures thereof.

Another particularly attractive embodiment of this invention is that it allows for the conventional materials and processing techniques used in photolithographic wafer processing to be used in combination with the methodologies described herein, to produce corresponding articles of manufacture. For example, in one embodiment, fabrication of a nanostructure further comprises the image-wise removing portions of the photoresist and passivating layer, be it polymer, polymer precursor, or otherwise, to form at least one pattern in which at least some part of at least one nanodimensioned device is not covered by the photoresist and passivating layer.

In another embodiment, fabrication of a nanostructure further comprises applying electrically conducting or semiconducting material to at least some portions of the nanodimensioned device exposed by removal of the photoresist and passivating layer portions, such that contact is made between the electrically conducting or semiconducting material and at least some part of at least one nanodimensioned device.

Figure 2:
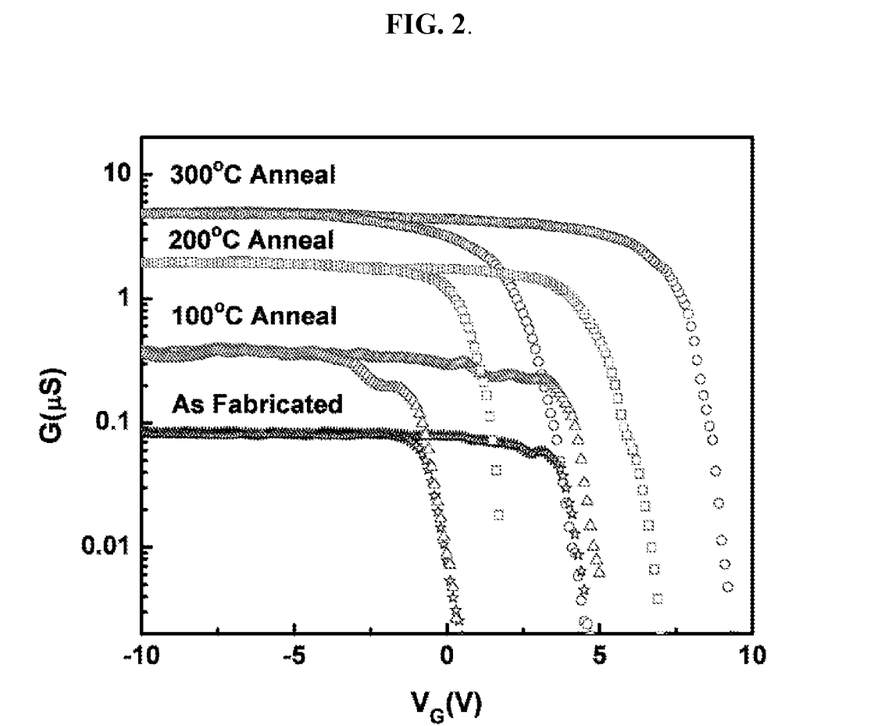
FIG. 2 shows current vs. gate voltage for a device manufactured by one embodiment of the present invention, after successively higher annealing temperatures after processing.
Figure 3:
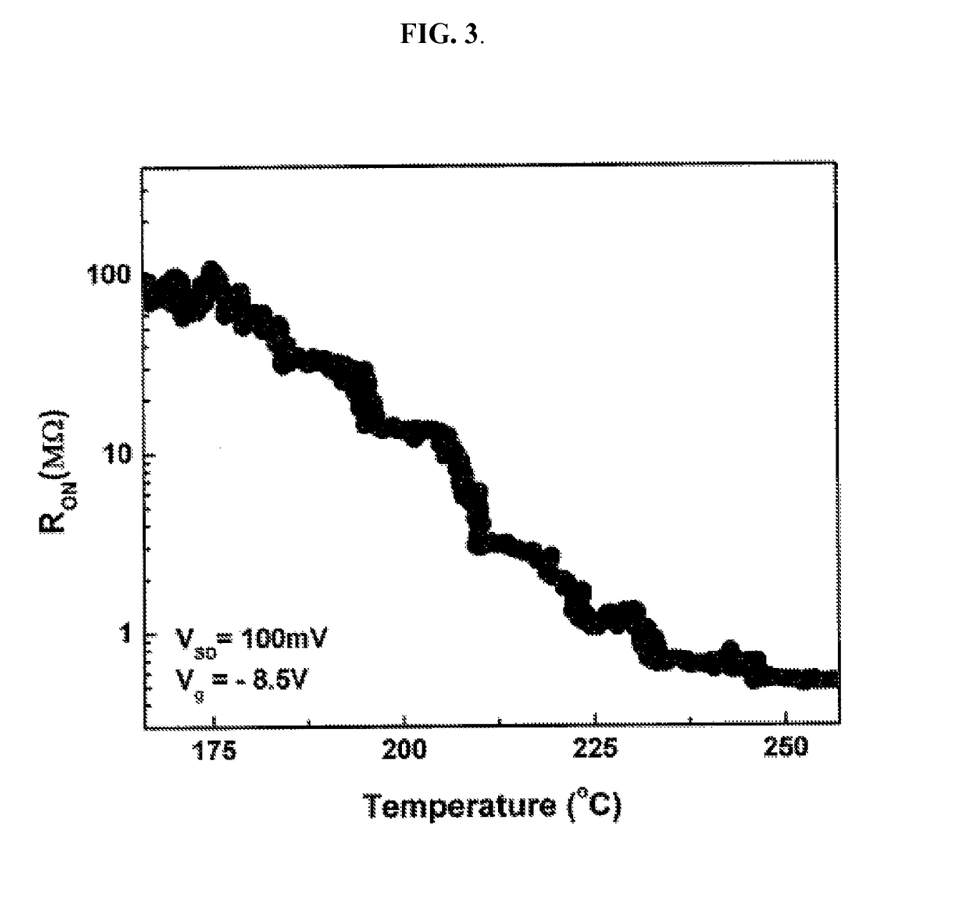
FIG. 3 shows on-state resistance as a function of annealing temperature of an as-fabricated single walled carbon nanotube field effect transistor.

In other embodiments, fabrication of a nanostructure further comprises annealing the nanostructure and and/or overcoating with one or more protective coating layers. The effect of the annealing of such devices are shown in FIGS. 2 and 3. FIGS. 2 and 3 both show the substantial decrease seen in the on-state resistance of semiconductor devices with increasing annealing temperatures.

Figure 4:
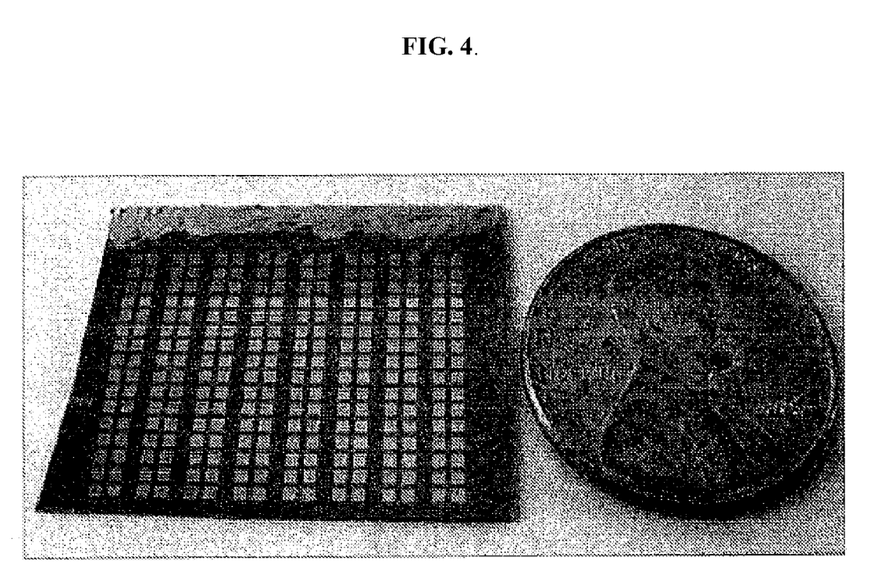
FIG. 4 presents an array of 128 devices fabricated on a 1"×0.75" substrate.

In other embodiments, a nanostructure with or without an electrical circuit is provided either singly or as an array on a single substrate. FIG. 4 shows an array of 128 devices fabricated on a 1"×0.75" substrate.

Finally, the invention also allows for further functionalization of the nanodevices, for use as, for examples flow meters and chemical sensors. In one embodiment, the invention provides a method of making and the associated nanostructure which comprises adhering biological molecules to at least some portions of the nanodimensioned devices, so as to enhance and tailor the chemical sensitivities of the nanodevices. By attaching different sequences of single strand DNA, polypeptides, proteins, and/or small organic molecules to these devices, the chemical environments are altered, leading to distinguishable chemical sensitivities.

Finally, while the preceding text are presented in terms of methods of fabrication, it is intended that the corresponding physical devices are within the scope of this invention. This includes nanostructures made from individual and intermediary processing steps up through an including the modules or assemblies which contain the nanostructures so-described.

EXPERIMENTAL

As those skilled in the art will appreciate, numerous modifications and variations of the present invention are possible in light of these teachings, and all such are contemplated hereby.

EXAMPLE 1

Carbon nanotubes were grown by chemical vapor deposition with a methane feedstock at 900° C. on degeneratively doped silicon wafers coated with 400 nm of thermally grown $SiO_2$. These wafers, containing the deposited carbon nanotubes, were then spin coated with 50 nm of polymethyl glutarimide (PMGI) resist (Microchem SF2S), and then with ca. 1 micron of Shipley S1813 photoresist. The wafers were patterned and exposed to UV light on a Karl Suss MA4 mask aligner, and then developed in two tanks of 2.2 wt % TMAH (tetramethyl ammonium hydroxide) solution. The first tank dissolved the exposed S1813 photoresist. The second tank etched the PMGI resist at a rate of 1 nm/sec. The photoimaged wafers were metalized, first with Cr, then Au via thermal evaporation.

In a two step process, the wafers were first soaked in acetone at 65° C. for 10 minutes to remove the S1813 and the attached metal. The wafers were then transferred to a 2.4 wt % solution of TMAH for 15 minutes to remove the remaining PMGI. The samples were sequentially rinsed in isopropanol and de-ionized water. The samples were annealed at 300° C. for one hour to remove any contaminants left along the body of the carbon nanotube FET.

EXAMPLE 2

Samples were prepared according to Example 1, except without the use of PMGI and the steps associated with its processing.

EXAMPLE 3

One thousand devices fabricated according to the process in Example 1 presented with an on-state resistance for semiconducting devices of 200 kΩ±50 kΩ, while 750 devices fabricated according to the process in Example 2 presented with an on-state resistance for semi-conducting devices of 5 MΩ±2 MΩ. See FIG. 1.

EXAMPLE 4

Samples prepared according to Example 1 were annealed at various temperatures and under various conditions to determine the effect of annealing temperature on performance. The devices were placed in the on-state by applying a bias voltage between the source and the drain electrodes of 100 mV, and the device voltages were held at a gate voltage of −8.5V as the temperature was raised from room temperature to 300° C., in steps of 100° C. (FIG. 2), and at a ramp rate of 0.5° C. per hour (FIG. 3).

What is claimed:

1. A method for fabricating a nanostructure comprising:
   (a) providing a substrate having at least one nanodimensioned device superposed upon it;
   (b) overlaying at least a portion of the nanodimensioned device with a layer of a passivating material to form a passivating layer which does not substantially interact with the nanodimensioned device by pi-pi overlap or covalent or ionic bonding; and
   (c) coating at least a portion of the overlaid passivating layer with at least one photoresist;
   wherein the nanodimensioned device comprises a conducting nanotube or nanowire, a semiconducting nanotube or nanowire, a metallic nanotube or nanowire, a mat of conducting, semiconducting, or metallic nanotubes or nanowires, or combinations thereof; and
   wherein the passivating material is a photosensitive aliphatic organic polymer or copolymer or comprises an aliphatic organic polymer or copolymer precursor or a saturated wax or aliphatic surfactant, said passivating material being susceptible to imaging and photoprocessing.

2. The method of claim 1, wherein the substrate is comprised of silicon, gallium arsenide, or indium phosphide, optionally coated with silicon dioxide.

3. The method of claim 1, wherein the substrate is comprised of doped silicon coated with silicon dioxide.

4. The method of claim 3, wherein the silicon dioxide layer has a thickness in a range of about 50 nanometers to about 500 nanometers.

5. The method of claim 1 wherein the nanodimensioned device comprises at least one carbon nanotube or nanowire, graphene, graphene oxide, reduced graphene oxide, or mixtures thereof.

6. The method of claim 1, wherein the nanodimensioned device comprises carbon nanotubes.

7. The method of claim 1, wherein the nanodimensioned device contains a microelectromechanical device.

8. The method of claim 1, wherein the nanodimensioned device is deposited upon the substrate by chemical vapor deposition.

9. The method of claim 1 wherein the passivating material is substantially free of pi-bond conjugated aromatic species.

10. The method of claim 1 wherein at least one passivating material layer is applied by spin coating.

11. The method of claim 1 wherein at least one passivating material comprises an aliphatic organic polymer or copolymer, or comprises an aliphatic organic polymer or copolymer precursor.

12. The method of claim 1 wherein at least one passivating material comprises a saturated wax or aliphatic surfactant.

13. The method of claim 11, wherein at least one polymers or polymer precursor layers comprises a polyglutarimide or polyalkyl glutarimide.

14. The method of claim 11, wherein at least one polymers or polymer precursor layers comprises a saturated acrylate, polyester, or polyolefin.

15. The method of claim 1, wherein at least one passivating layer is at least about 10 nanometers thick.

16. The method of claim 1, wherein at least one passivating layer has a thickness in a range of from about 10 nanometers to about 100 nanometers.

17. The method of claim 1, wherein at least one passivating layer has a thickness in a range of from about 25 nanometers to about 75 nanometers.

18. The method of claim 1, wherein at least one photoresist comprises phenolic, poly(vinyl cinnamate), or styrene polymers, co-polymers, or mixtures thereof.

19. The method of claim 1, wherein at least one photoresist is deposited by spin coating, dip coating, painting, or screen printing.

20. The method of claim 1, wherein at least one layer of photoresist has a thickness in a range of from about 20 nanometers to about 10,000 nanometers.

21. The method of claim 1, wherein at least one layer of photoresist is about 0.1 microns thick.

22. The method of claim 1, wherein at least one photoresist is a positive-tone photoresist.

23. The method of claim 1 further comprising the simultaneous imaging of a plurality of patterns on the substrate.

24. The method of claim 1 further comprising image-wise removing portions of the photoresist and the passivating layer to form at least one pattern in which at least some part of at least one nanodimensioned device is not covered by the photoresist and the passivating material layer.

25. The method of claim 24 further comprising applying electrically conducting or semiconducting material to at least some portions of the nanodimensioned device exposed by removal of the photoresist and passivating material portions, such that contact is made between the electrically conducting or semiconducting material and at least some part of at least one nanodimensioned device.

26. The method of claim 25, wherein the electrically conducting material is at least one metal.

27. The method of claim 26, wherein the at least one metal is chromium, copper, or gold.

28. The method of claim 26, wherein multiple metals are deposited sequentially.

29. The method of claim 26, wherein the at least one metal is deposited by sputtering or chemical vapor deposition.

30. The method of claim 25 wherein the method provides an electrical circuit.

31. The method of claim 25 further comprising annealing the nanostructure.

32. The method of claim 31, wherein the annealing temperature is above the boiling points of any solvents used in the processing or solvents or monomers originally contained in the at least one passivating material or the at least one photoresist.

33. The method of claim 31, wherein the annealing temperature is from about 100 to about 300 degrees Celsius.

34. The method of claim 25 further comprising adhering biological molecules to at least some portions of the nanodimensioned devices.

35. The method of claim 25, further comprising applying a protective coating over the nanostructure.

36. A method for fabricating a nanostructure comprising:
(a) providing a substrate having at least one nanodimensioned device superposed upon it, wherein the nanodimensioned device comprises a conducting nanotube or nanowire, a semiconducting nanotube or nanowire, a metallic nanotube or nanowire, a mat of conducting, semiconducting, or metallic nanotubes or nanowires, or combinations thereof;
(b) overlaying at least a portion of the nanodimensioned device with a layer of a passivating material to form a passivating layer, the passivating layer being a photosensitive aliphatic organic polymer or copolymer, or comprises an aliphatic organic polymer or copolymer precursor or a saturated wax or aliphatic surfactant, said passivating material being susceptible to imaging and photoprocessing and, which does not substantially interact with the nanodimensioned device by pi-pi overlap or covalent or ionic bonding;
(c) coating at least a portion of the passivating layer with at least one photoresist;
(d) image-wise removing portions of the photoresist and the passivating material layer to form a pattern in which at least some part of at least one nanodimensioned device is not covered by the photoresist and the passivating material layer;
(e) applying electrically conducting or semiconducting material to at least some portions of the nanodimensioned device exposed by removal of the photoresist and the passivating material portions, such that contact is made between the electrically conducting or semiconducting material and at least some part of at least one nanodimensioned device;
(f) optionally repeating steps (b) through (e) at least once; and
(g) optionally annealing the nanostructure.

37. A nanostructure or array of nanostructures fabricated from the method of claim 1.

38. A nanostructure comprising a substrate having at least one nanodimensioned device superposed upon it, wherein at least a portion of the nanodimensioned device is coated with at least one layer of a passivating material which does not substantially interact with the nanodimensioned device by pi-pi overlap or covalent or ionic bonding;
wherein the nanodimensioned device comprises a conducting nanotube or nanowire, a semiconducting nanotube or nanowire, a metallic nanotube or nanowire, a mat of conducting, semiconducting, or metallic nanotubes or nanowires, or combinations thereof; and
wherein the passivating layer comprises a photosensitive aliphatic organic polymer or copolymer, or comprises an aliphatic organic polymer or copolymer precursor or a saturated wax or aliphatic surfactant, said passivating material being susceptible to imaging and photoprocessing.

39. An assembly comprising the nanostructure of claim 37.

* * * * *